United States Patent
Zibold et al.

(10) Patent No.: US 7,916,930 B2
(45) Date of Patent: Mar. 29, 2011

(54) METHOD AND ARRANGEMENT FOR REPAIRING PHOTOLITHOGRAPHY MASKS

(75) Inventors: Axel Zibold, Jena (DE); Wolfgang Harnisch, Lehesten (DE); Oliver Kienzle, Jena (DE)

(73) Assignee: Carl Zeiss SMS GmbH, Jena (DE)

( * ) Notice: Subject to any disclaimer, the term of this patent is extended or adjusted under 35 U.S.C. 154(b) by 865 days.

(21) Appl. No.: 11/900,946

(22) Filed: Sep. 14, 2007

(65) Prior Publication Data

US 2008/0069431 A1      Mar. 20, 2008

Related U.S. Application Data

(60) Provisional application No. 60/844,824, filed on Sep. 15, 2006.

(30) Foreign Application Priority Data

Sep. 15, 2006   (DE) .................. 10 2006 043 874

(51) Int. Cl.
*G06K 9/00*   (2006.01)

(52) U.S. Cl. ........................... 382/144; 430/5

(58) Field of Classification Search .......... 382/141–152; 348/86–95, 125–134; 356/237.1–237.6; 430/5

See application file for complete search history.

(56) References Cited

U.S. PATENT DOCUMENTS

| | | | |
|---|---|---|---|
| 4,727,234 A | 2/1988 | Oprysko et al. | |
| 4,778,693 A | 10/1988 | Drozdowicz et al. | |
| 4,906,326 A | 3/1990 | Amemiya et al. | |
| 5,795,685 A | 8/1998 | Liebmann et al. | |
| 6,272,236 B1 | 8/2001 | Pierrat et al. | |
| 6,440,615 B1 * | 8/2002 | Shimizu | 430/5 |
| 6,709,554 B2 | 3/2004 | Ferranti et al. | |
| 6,753,538 B2 * | 6/2004 | Musil et al. | 250/492.2 |
| 7,002,165 B2 | 2/2006 | Lin | |
| 7,005,219 B2 * | 2/2006 | Chin et al. | 430/5 |
| 7,150,946 B2 * | 12/2006 | Schulze et al. | 430/5 |
| 7,157,190 B2 * | 1/2007 | Ramstein | 430/5 |
| 7,375,324 B2 * | 5/2008 | Linder et al. | 250/307 |
| 2003/0047691 A1 * | 3/2003 | Musil et al. | 250/492.2 |
| 2004/0146787 A1 * | 7/2004 | Ramstein | 430/5 |
| 2004/0151991 A1 | 8/2004 | Stewart et al. | |
| 2004/0151993 A1 | 8/2004 | Hasegawa et al. | |
| 2004/0179726 A1 | 9/2004 | Burdorf et al. | |
| 2005/0153213 A1 * | 7/2005 | Schulze et al. | 430/5 |
| 2005/0196688 A1 | 9/2005 | Kim et al. | |
| 2006/0154150 A1 | 7/2006 | Engel et al. | |
| 2008/0069431 A1 * | 3/2008 | Zibold et al. | 382/144 |
| 2008/0079931 A1 * | 4/2008 | Lim et al. | 356/237.1 |
| 2009/0095922 A1 * | 4/2009 | Lee et al. | 250/492.1 |
| 2010/0254591 A1 * | 10/2010 | Scherubl et al. | 382/144 |

FOREIGN PATENT DOCUMENTS

WO   WO 2004/006013 A1   1/2004

* cited by examiner

*Primary Examiner* — Aaron W Carter
(74) *Attorney, Agent, or Firm* — Patterson Thuente Christensen Pedersen, P.A.

(57) ABSTRACT

A method and apparatus for the repair of photolithography masks, wherein a photolithography mask is examined for the presence of defects and a list of the defects is generated, in which at least one type of defect, its extent, and its location on the photolithography mask is assigned to each defect, and these defects are repaired.

13 Claims, 2 Drawing Sheets

METHOD AND ARRANGEMENT FOR REPAIRING PHOTOLITHOGRAPHY MASKS

RELATED APPLICATION

This application claims priority from German Application No. 10 2006 043 874.4, filed Sep. 15, 2006 and from U.S. Provisional Application No. 60/844,824 filed Sep. 15, 2006, the disclosures of which are hereby incorporated by reference.

FIELD OF THE INVENTION

The present invention generally relates to photolithography masks. More particularly, the embodiments of the present invention relate to methods and apparatuses for the repair of photolithography masks.

BACKGROUND OF THE INVENTION

Various repair methods can be employed to repair photolithography masks. Repair work can be affected, for example, using ion beams or what is called nano-machining. A repair based on irradiation of the material with laser beams can be well-suited for large defects. This method can be particularly well-suited for "opaque" defects, i.e., for defects wherein excessive material is present and needs to be removed. If the laser beam is supplemented by a depositing means for deposition of material, "transparent" defects can be corrected, i.e., defects where material is missing.

For defects having particularly small structures and for masks by which a high structural resolution is to be achieved, further methods can be better-suited, for example, a repair method based on electron beams. This method can enable removal of material in the case of "opaque" defects and the addition of material in the case of "transparent" defects. This is affected by an additional deposition mechanism, in which the electron beam induces a chemical reaction in the deposition material, so that the added molecules combine with the material structure. However, in the case of large defects, this method can be very slow, such that it can be efficiently employed only for small defects. On the other hand, the repair using laser beams enables the treatment of large defects. However, due to its low resolution, the method can be very inaccurate.

In known repair devices, only one of the methods is usually implemented. However, since both small and large defects may occur on one type of mask, the repair of the defects is complex and may take very long under certain circumstances. Also, such apparatus can be inflexible with respect to the repair of different types of mask—each type representing a structural resolution which is achievable by this mask on a wafer, e. g., 32 nm, 45 nm, 65 nm, or 90 nm.

WO 2004/006013A1 describes an arrangement for the production of photomasks that comprises a defect control system and one or more repair systems connected thereto, all systems being connected to each other via data links, thus enabling a mutual influence. Both material-depositing and material-removing devices can be used as repair systems. For example, the arrangement may comprise a laser removal system, an atomic force microscope, an ion beam system or an electron beam-based depositing system. The arrangement described in WO 2004/006013A1 may comprise a database system which can make a repair suggestion for detected defects that are known and have been previously stored. An essential aspect of WO 2004/006013A1 is the integration of measurement and repair systems within the arrangement for producing the mask. In this case, a defect is analyzed in the arrangement and one of several repair methods is selected. This step can be carried out repeatedly. However, this arrangement is designed for the repair of only one type of mask.

There is therefore a need for an improved method and device for the repair of photolithography masks.

SUMMARY OF THE INVENTION

The embodiments of the present invention relate to a device for the repair of photolithography masks. Such a device can comprise an inspection module in which a photolithography mask is examined for the presence of defects and a list of the defects is generated, in which at least one type of defect, its extent, and its location on the photolithography mask is assigned to each defect, and also can comprise an emulation module which analyzes whether the any deviations the defects generate, during photolithographic imaging of the photolithography mask, with respect to one or more predetermined specifications are outside predetermined tolerances. Thus, the entire mask is examined, first of all, in the inspection module, and a list of the defects is generated. In this list, at least the following properties are assigned to each defect: a type of defect, its extent and its location on the photolithography mask. In the inspection module, a first analysis is also affected as to whether the defects have a negative effect on imaging or not. If the defects exceed a certain extent, they need not be examined any further, but it can be decided at once that these defects have to be repaired. In the case of defects having smaller dimensions, a more detailed analysis using the emulation model—for example, the Aerial Image Measurement System (AIMS) by Zeiss—can be carried out, if necessary. All defects found in the inspection module can also be subjected to a first repair.

In a method, this object is achieved in that the repair is effected according to the following steps for each of the defects to be repaired: (i) depending on a type of mask, the defect type, and the extent of the defect, one of several predetermined repair methods is selected, and repair of the photolithography mask is carried out according to the selected repair method. (ii) It is then analyzed again whether any deviations the repaired defect generates, during imaging, with respect to one or more predetermined specifications are outside predetermined tolerances. (iii) The two preceding steps (i) and (ii) are carried out again, if the deviations are outside the predetermined tolerances; otherwise, the repair of the defects is completed and the photolithography mask is verified. Since an individual repair method can be selected for each defect and each mask type, this results in increased efficiency over the prior art.

If the deviations are outside the predetermined tolerances, it is not mandatory to select the same repair method for the renewed repair. Rather, the repair method to be used can be determined by the result of the analysis. Thus, it is actually possible that a defect may change from an "opaque" type of defect to a "transparent" type of defect due to excessive material removal. Also, the extent of the defect on the photolithography mask, i.e., the length, width, and/or diameter of the defect, will usually change during repair. Depending on the extent of the defects, as well as on their type, different repair methods can thus be selected in the subsequent steps of repair. Therefore, these features can also be determined anew during analysis of the repaired defect.

Optionally, some or all of the defects indicated in the list can also be analyzed prior to repair as to whether any deviations they generate, during photolithographic imaging, with respect to one or more predetermined specifications are outside predetermined tolerances. This enables a pre-selection showing whether the analyzed defect has to be repaired at all. This is advantageous, in particular, for phase-shift masks whose structures are not imaged directly onto the wafer. This examination, which can be carried out in the AIMS, for example, enables exclusion of some defects, under certain circumstances, that accordingly need not be repaired. However, the analysis is more complex than the mask inspection.

While there are different repair methods for the repair of photolithography masks, the process can combine the two extreme methods, i.e., a repair using electron beams is provided as the first repair method and a repair using laser beams is provided as the second repair method. The first repair method using electron beams is particularly suitable for small structures as regards both the extent of the defect and the type of mask. The electron beam repair can also be combined with material deposition, so that material can also be deposited and defects of the "transparent" type can likewise be removed. The second repair method is suitable, in particular, for mask types which produce larger structures as well as for defects having a larger extent. Additional material can be deposited in this case, too, so that both defects of the "opaque" type and of the "transparent" type can be repaired. It is also possible, of course, to provide more than two repair methods. Even a combination of two other methods is conceivable.

For mask types intended to generate structures having an extent of 65 nm—65 nm node—and below, the first repair method is conveniently selected due to its greater accuracy; otherwise, the second repair method is selected first. This means an increase in efficiency in the case mask types for structures with an extent of 90 nm and more as compared to a treatment using only the first repair method which operates only on small surfaces and, thus, takes much longer than the second repair method to repair a surface having a predetermined extent.

For mask types which generate structures having an extent of 65 nm and below, the first repair method is selected if the defect is assigned a "transparent" defect type, and for defects which are assigned an "opaque" defect type, the first or the second repair method is selected depending on the extent of said defects. This means a further increase in efficiency: In order to achieve maximum efficiency, one will try to repair as many defects as possible using the second repair method, i.e., laser beam treatment, because this method enables machining of larger surface areas in a shorter time. For certain mask types, namely photolithography masks which are provided to generate structures having an extent of 65 nm and below, and also for 45 nm or 32 nm, the first repair method using electron beam treatment is almost exclusively suitable due to the size of the structures. However, for particularly large defects having extents of, for example, more than 1 nm, a repair—albeit a more superficial one—using the second method based on a laser beam treatment is also possible.

The first repair method can be used at the end to carry out a final finishing operation on one or more of the repaired defects. This is appropriate, in particular, for the defects of the masks which serve to generate structures having an extent of 65 nm and less, but which, due to their size, were initially treated using the second repair method.

The repaired defect is then conveniently analyzed using an emulation unit for photolithographic scanners, analyzing whether any deviations said defect generates, during imaging, with respect to one or more predetermined specifications are outside predetermined tolerances. The defect type and the extent of the defect can then also be determined again. Such emulation unit provides the advantage that it realistically emulates the imaging behavior of a photolithographic scanner, i.e., the use of the mask, although the mask is not imaged several times reduced in size, as in the case of a scanner, but is imaged with multiple magnification. This enables a much more precise analysis than, for example, in the case of mask inspection. The method can be carried out such that the defects are completely repaired individually, one after the other. Alternatively, it is also possible to carry out a first repair for all defects, then analyze all defects and subject any defects which do not yet satisfy the tolerance criteria to a further repair.

The method can also be combined with further steps that are relevant during mask production. Thus, it is possible, for example, to include a cleaning step or an analysis of the critical dimension using secondary electron microscopy.

For a device of the above-described type, the object is achieved in that the device is provided with several repair modules for repair of the defects, each of the repair modules having implemented therein a repair method which differs from the repair methods implemented in the other repair modules, and a control module is provided which controls at least the repair modules and the emulation module and, depending on a mask type, the defect type and the extent of the defect, selects one of the repair modules to which the photolithography mask is transferred for repair. Moreover, the control module can also control the inspection module, which requires the control module to know at least the list of defects generated in the inspection module.

The device according to embodiments of invention is also particularly suitable to carry out the method according to embodiments invention, in particular also to carry out said method automatically.

In the control module, the list of defects that need to be repaired is accordingly processed, one item after another, until all defects have been repaired. Thus, advantageously, the correspondingly most efficient repair method can be selected for each defect and for each type of mask. However, the repair of a defect is usually an iterative process which is carried out until the deviations from predetermined specifications are within predetermined tolerances. For this purpose, the device is conveniently designed such that it analyzes the photolithography mask in the emulation module after repair. Depending on the result of the analysis, the control module optionally selects a repair module again to which the photolithography mask is transferred for further repair. In contrast to the prior art, it is also possible to select a different repair module, depending on whether the analysis of the defect has shown corresponding changes with respect to the type and/or extent of such defect. Therefore, the type and/or extent of the defect are conveniently analyzed as well. Thus, the device responds to such changes in a flexible manner, enabling to make the repair process more efficient.

A repair method using electron beams can be implemented in a first repair module and a repair method using laser beams is implemented in a second repair module. As already explained in more detail above, these are the two extreme repair methods for particularly large or small structures. In this way, the most important repair methods are available to the user. Of course, further modules including further methods, such as the repair method using a focused ion beam, for example, can be provided as well, but the use of the two aforementioned repair modules is the less expensive and more efficient alternative, because it enables all regions to be covered. This applies, in particular, if the modules are additionally provided with means for depositing material on the mask.

Conveniently, the second repair module is provided with an insertable membrane through which the laser beams are directed onto the photolithography mask. Said membrane usually has a thickness of 50 to 100 nm and is mounted approximately 7 mm above the mask surface. It is optically ineffective and substantially serves to protect the repaired site against soiling.

Finally, further modules that play a role in the production and verification of photolithography masks may be provided as well. Thus, for example, it is possible to provide a cleaning module or a module which verifies the critical dimension by secondary electron microscopy.

Figure 1:
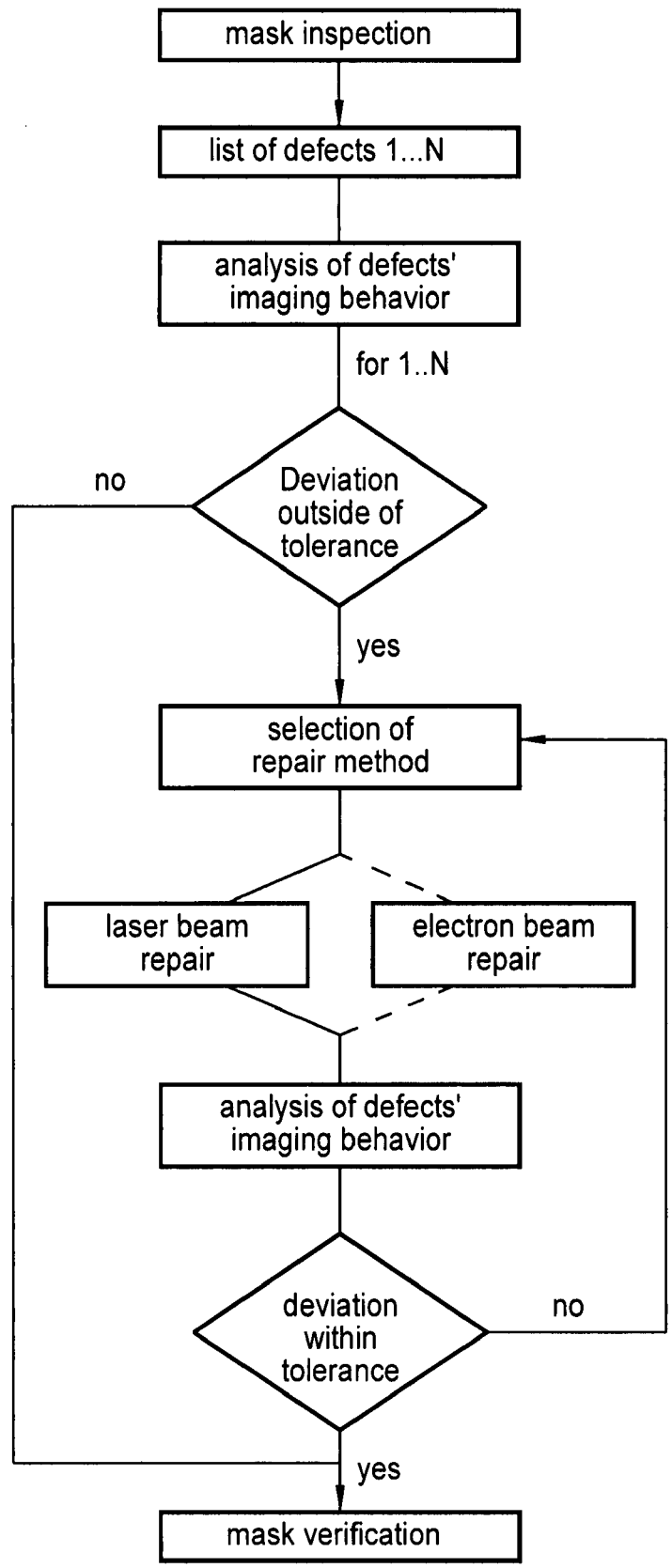
FIG. 1 depicts the course of the process.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives.

DETAILED DESCRIPTION OF THE DRAWINGS

FIG. 1 depicts the basic course of the method according to an embodiment of the invention. The mask is first examined in a mask inspection system for the presence of defects. In the present example, N defects are found on the mask. For these defects, a list is generated in which each defect is assigned, inter alia, a defect type, the extent of the defect and the location of the defect on the photolithography mask. These defects are then analyzed with respect to their imaging behavior, i.e., it is examined whether any deviations they generate, during photolithographic imaging of the mask, with respect to one or more predetermined specifications are outside predetermined tolerances. For some large defects, this can be easily determined already during inspection, while others can be or have to be examined in more detail, for example by an emulation unit which emulates the imaging behavior of a photolithographic scanner. The predetermined specifications may differ according to the mask type. Thus, the specifications of phase-shift masks will differ from those of pure transmitted-light masks. Depending also on the size of the structures to be generated—e.g., if a 65 nm node mask or a 90 nm node mask is used—other specifications and tolerances may result, for example, with respect to a process window. If the deviations are within the tolerances, no further steps will be required, so that the defect will require no further observation and can be deleted from the list as having been repaired. However, if any of the deviations is located outside a predetermined tolerance—one deviation is usually sufficient to start the repair cycle—this defect will be repaired. In doing so, one of several predetermined repair methods is selected, first of all, depending on the mask type, the defect type as well as the extent of the defect. Although the present example provides two repair methods, this should be understood only as an example, it being possible to provide several repair methods as well. In the example, a repair method using a laser beam treatment is provided for large structures and a repair method based on an electron beam treatment is provided for small structures. Depending on the mask type, the defect type and the extent of the defect, one or the other of said methods is then selected. For example, using a photolithography mask designed to generate structures of 90 nm (90 nm node), the repair can be carried out initially using a laser beam treatment regardless of the type of defect—e.g., "transparent" for defects with material missing and "opaque" for defects where too much material is present on the mask. Both laser beam repair and electron beam repair enable for the deposition of material on the mask, so that "transparent" defects can be repaired, too. The selected repair method is indicated here by transparent lines, while the other available method, although not selected in this step, can be reached via the branch depicted in broken lines. This method could be used, for example, for mask types designed to generate structures having an extent of 65 nm and below, unless the defects have a particularly large extent of, for example, more than 100 nm.

After the defect has been repaired, a first-time analysis or a renewed analysis concerning the deviations in imaging with respect to one or more predetermined specifications is affected. In doing so, the defect type is conveniently determined again, and so is the extent of the defect. If the deviations are outside the predetermined tolerance, a repair method is selected again on the basis of the above-mentioned criteria and a renewed repair is carried out. This cycle is repeated until the deviations for the repaired defect are within the tolerances. Once this repair cycle has been carried out for all defects requiring repair, the mask can be finally verified.

Figure 2:
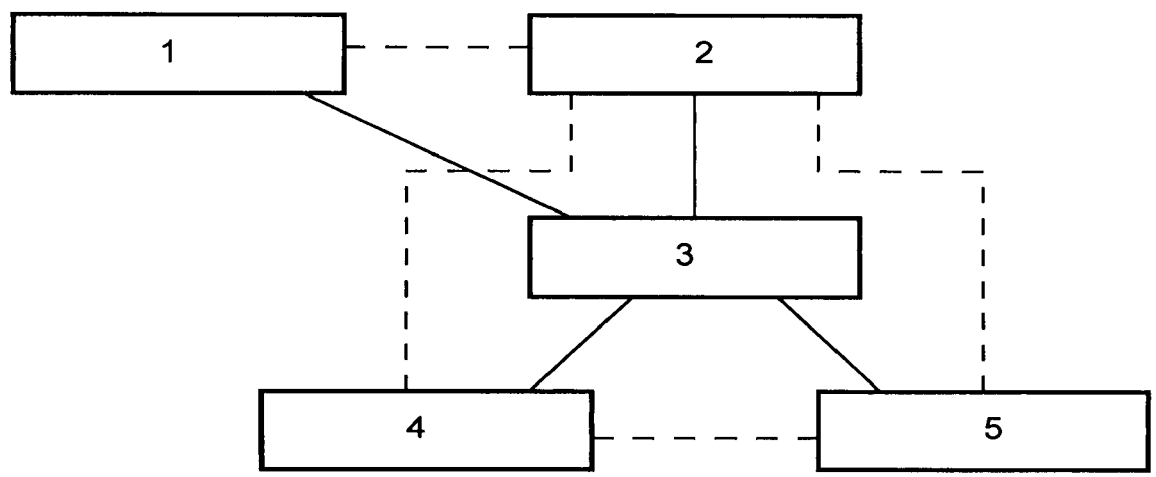
FIG. 2 depicts a diagrammatic sketch of a device according to an embodiment that is also suitable to carry out said process.

By way of example, FIG. 2 depicts a diagram of a device which can carry out the method according to an embodiment of the invention. The mask is first examined in the inspection module 1 for the presence of defects, then a corresponding list of the defects including at least the above-mentioned entries is generated. Next, the defects contained in the list are optionally analyzed as to whether any deviations they generate with respect to one or more predetermined specifications during photolithographic imaging are outside predetermined tolerances. A more detailed analysis may optionally be affected in an emulation module 2 if the superficial analysis in the inspection module 1 is not sufficient. The emulation module 2 may be, for example, an AIMS by Zeiss.

The inspection module 1 and the emulation module 2 are coupled to a control module 3. The control module 3 controls these two modules as well as two repair modules 4 and 5, and selects one of the two repair modules 4 or 5, respectively having different repair methods implemented therein, for a repair depending on the mask type, the defect type as well as the extent of the defect. Thus, for example, an electron beam repair method—for example, in MeRiT by Zeiss—may be implemented in the repair module 4 and a repair method based on a laser beam treatment may be implemented in the repair module 5. In both repair modules, a deposition means may be provided which serves to deposit material so as to repair "transparent" defects. It is also possible to provide further repair modules, in which other repair methods are implemented, as well as further modules that are useful during production and control, such as a cleaning module, etc. Thus, depending on the aforementioned parameters, one of the repair modules 4 or 5 is selected. In doing so, the device is designed such that the selection and repair can be effected automatically. The paths traveled by the mask in the device are depicted by broken lines. A direct transfer of the mask to be repaired from the inspection module to one of the repair modules 4 or 5 is also possible, but is not depicted so as to provide a better overview. In this context, two variants are basically possible: first of all, a first repair can be carried out for each defect, in which case the mask may possibly have to be transported back and forth between the repair modules 4 and 5. After this first repair, all repaired defects are analyzed in the emulation module and optionally deleted from the list if the deviations are now within the tolerance. Otherwise, a renewed repair is carried out. As an alternative, the repair can also be carried out as completely as possible for each of the defects. After the first repair step, the mask is moved into the emulation module where the repaired defect is examined, then a renewed repair is carried out if the deviations from one or more of the predetermined specifications are outside the predetermined tolerances during imaging. The method selected in the second step and, thus, the repair module may differ from the method used in the first step. Both procedures achieve the same, so that they are to be regarded as equivalent.

What is claimed is:

1. A method for the repair of photolithography masks, wherein a photolithography mask is examined for the presence of defects and a list of defects is generated in which at least one type of defect, its extent, and its location on the photolithography mask is assigned to each defect, and these defects are repaired, said method comprising:
    selecting one of several predetermined repair methods depending on a mask type, a defect type, and an extent of the defect, and repairing a photolithography mask according to the selected repair method;
    analyzing the repaired defect as to whether any deviations it generates, during imaging, from one or more predetermined specifications are outside predetermined tolerances; and
    if the deviations are outside the predetermined tolerances, carrying out said steps of selecting and analyzing again, otherwise, the repair of the defect is completed and the photolithography mask is verified.

2. The method of claim 1, wherein the defects contained in the list are analyzed prior to repair as to whether any deviations they generate with respect to one or more predetermined specifications during photolithographic imaging of the photolithography mask are outside predetermined tolerances.

3. The method of claim 1, wherein the analysis of the repaired defect involves determining at least one of the extent of the defect or the defect type again.

4. The method of claim 1, wherein a repair using electron beams is provided as a first repair method and a repair using laser beams is provided as a second repair method.

5. The method of claim 4, wherein the first repair method is used for mask types generating structures with an extent of about 65 nm and below, and if not, the second repair method is used first.

6. The method of claim 4, wherein the first repair method is selected for mask types generating structures with an extent of about 65 nm and below, if the defect is assigned a "transparent" defect type, and the first or second repair method is used for defects which have been assigned an "opaque" defect type.

7. The method of claim 4, wherein a final finishing operation of one or more of the defects is carried out using the first repair method.

8. A device for repairing photolithography masks, said device comprising:
    an inspection module, wherein a photolithography mask is examined for the presence of defects and a list of the defects is generated in which at least one type of defect, its extent, and its location on the photolithography mask is assigned to each defect;
    an emulation module which analyzes whether any deviations the defects generate, during photolithographic imaging of the photolithography mask, with respect to one or more predetermined specifications are outside predetermined tolerances, wherein several repair modules are provided to repair the defects, each of the repair modules having implemented therein a repair method which differs from the repair methods implemented in the other repair modules; and
    a control module is provided which controls at least the repair modules and the emulation module and, depending on a mask type, the defect type and the extent of the defect, selects one of the repair modules to which the photolithography mask is transferred for repair.

9. The device of claim 8, wherein the device analyzes the photolithography mask in the emulation module after repair and the control module selects a repair module again to which the photolithography mask is transferred for further repair.

10. The method of claim 8, wherein the emulation module, when analyzing the repaired defect, determines at least one of the extent of the defect or the defect type again.

11. The device of claim 8, wherein a repair method using electron beams is implemented in a first repair module and a repair method using laser beams is implemented in a second repair module.

12. The device of claim 11, wherein an insertable membrane is provided in the second repair module, through which membrane the laser beams are directed onto the photolithography mask.

13. A method for the repair of photolithography masks, said method comprising:
    selecting one of a plurality of predetermined repair methods depending on one or more of a mask type, a defect type, and a defect extent, and repairing a defect of a photolithography mask according to the selected repair method; and
    analyzing the repaired defect to determine whether any deviations it generates, during imaging, are outside one or more predetermined tolerances,
        wherein if the deviations are outside said one or more predetermined tolerances, repeating said steps of selecting and analyzing, and
        wherein if the deviations are not outside the predetermined tolerances, said photolithography mask is verified.

* * * * *

UNITED STATES PATENT AND TRADEMARK OFFICE
CERTIFICATE OF CORRECTION

PATENT NO. : 7,916,930 B2  
APPLICATION NO. : 11/900946  
DATED : March 29, 2011  
INVENTOR(S) : Axel Zibold, Wolfgang Harnisch and Oliver Kienzle Page 1 of 1

It is certified that error appears in the above-identified patent and that said Letters Patent is hereby corrected as shown below:

Col. 2, line 17. Claim 8 should be deleted "whether the any deviations the defects generate".

Signed and Sealed this  
Tenth Day of April, 2012

David J. Kappos  
*Director of the United States Patent and Trademark Office*